US005654836A

United States Patent [19]
Oh

[11] Patent Number: 5,654,836
[45] Date of Patent: Aug. 5, 1997

[54] METHOD AND CIRCUIT FOR DETECTING AUTO TRACKING FIND ERROR IN A VIDEO CASSETTE RECORDER AND ACCORDINGLY CONTROLLING CAPSTAN PHASE FOR CORRECT VIDEO HEAD TRACKING

[75] Inventor: Yong Gyu Oh, Seoul, Rep. of Korea

[73] Assignee: Goldstar Co., Ltd., Seoul, Rep. of Korea

[21] Appl. No.: 623,123

[22] Filed: Mar. 28, 1996

Related U.S. Application Data

[63] Continuation of Ser. No. 346,716, Nov. 30, 1994, abandoned, which is a continuation of Ser. No. 972,743, Nov. 6, 1992, abandoned.

[30] Foreign Application Priority Data

Nov. 9, 1991 [KR] Rep. of Korea ............... 19926/1991

[51] Int. Cl.$^6$ ................................................ G11B 5/588
[52] U.S. Cl. .......................... 360/70; 360/73.04; 318/437
[58] Field of Search ........................... 360/73.04, 77.14, 360/70, 77.15, 73.09, 73.11; 318/437, 799, 85; 300/77.13

[56] References Cited

U.S. PATENT DOCUMENTS

| | | | |
|---|---|---|---|
| 4,247,741 | 1/1981 | Tatsuguchi et al. | 369/43 |
| 4,297,733 | 10/1981 | Sanderson | 360/77.14 |
| 4,497,000 | 1/1985 | Terada et al. | 360/70 |
| 4,594,615 | 6/1986 | Nemoto et al. | 360/10.2 |
| 4,658,309 | 4/1987 | Yasuda et al. | 360/77.14 |
| 4,804,894 | 2/1989 | Machida et al. | 318/314 |
| 4,809,096 | 2/1989 | Azuma et al. | 360/77.15 |
| 4,816,930 | 3/1989 | Kubo et al. | 360/10.2 |

FOREIGN PATENT DOCUMENTS 27 55 652 A1  12/1977  Germany.

*Primary Examiner*—Aristotelis Psitos
*Assistant Examiner*—James T. Wilson
*Attorney, Agent, or Firm*—David E. Lovejoy

[57] ABSTRACT

A method and A circuit for detecting an auto tracking find error in a VCR, wherein a phase control range for a capstan motor is widened as compared with the prior art so that, when a phase of the capstan motor is widely detuned, the following speed for stabilization of the phase of the capstan motor can be made fast. According to the invention, in an interval of $-\pi$–$\pi$ of the phase of the capstan motor, first latch data is selected as a phase error signal for control of the phase of the capstan motor. In intervals of $-2\pi$—$\pi$ and $\pi$–$2\pi$ of the phase of the capstan motor, second latch data is multiplied by two and is then of the same polarity as that of the first latch data. The second latch data multiplied by two is added to the first latch data. In result, the added value is selected as the phase error signal. Also, a portion of the data above double the upper limit value is cut in the interval of $-2\pi$—$\pi$ and a portion of the data below double the lower limit value is cut in the interval of $\pi$–$2\pi$.

7 Claims, 7 Drawing Sheets

FIG. 4A PRIOR ART HSW
FIG. 4B PRIOR ART ½HSW
FIG. 4C PRIOR ART Edge Signal
FIG. 4D PRIOR ART Counter
FIG. 4E PRIOR ART SEL1
FIG. 4F PRIOR ART SEL2
FIG. 4G PRIOR ART ATF Voltage

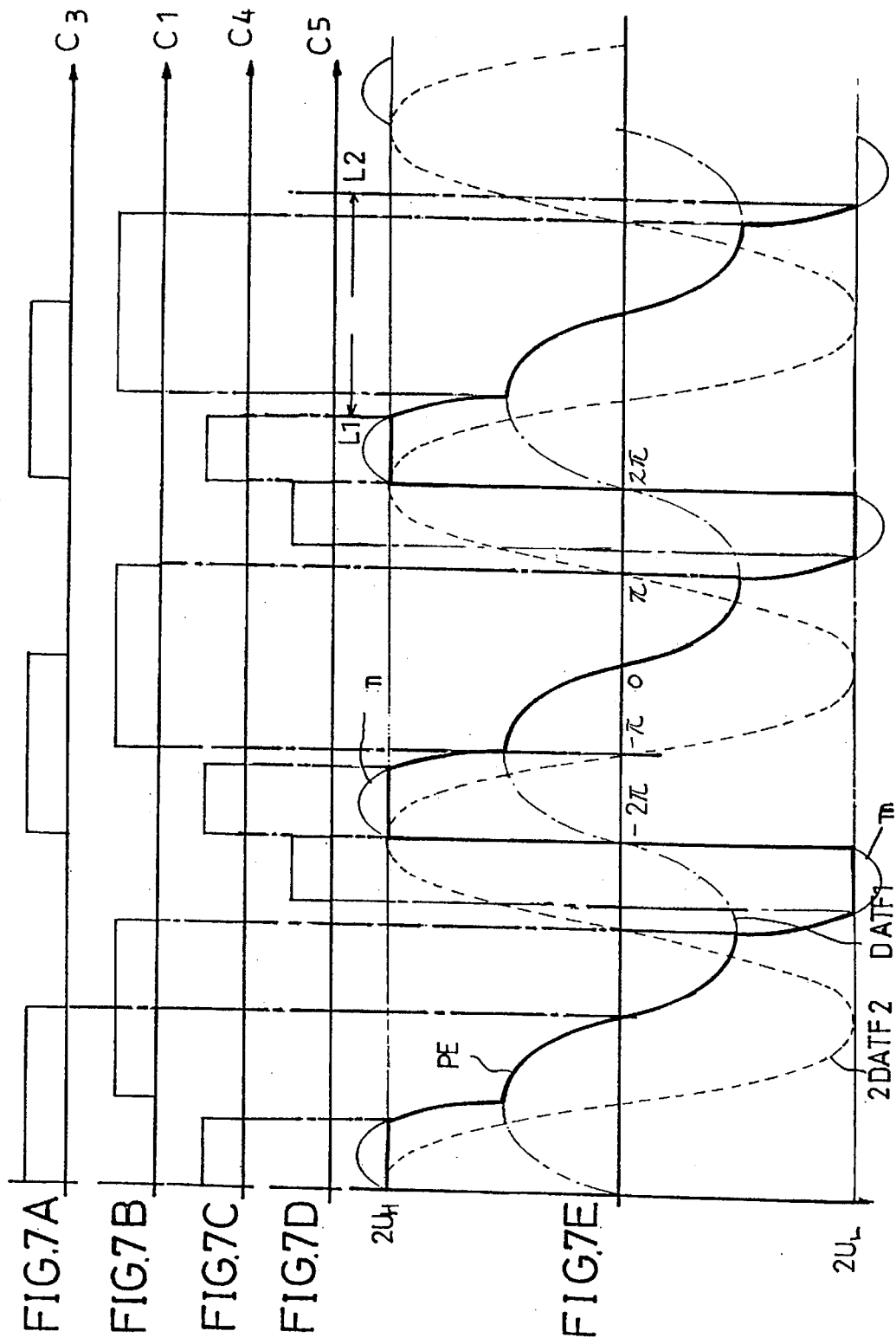

METHOD AND CIRCUIT FOR DETECTING AUTO TRACKING FIND ERROR IN A VIDEO CASSETTE RECORDER AND ACCORDINGLY CONTROLLING CAPSTAN PHASE FOR CORRECT VIDEO HEAD TRACKING

This application is a continuation of Ser. No. 08/346,716 filed Nov. 30, 1994 (now abandoned), which is a continuation of Ser. No. 07/972,743 filed Nov. 6, 1992, (now abandoned).

BACKGROUND OF THE INVENTION

1. Field of the Invention

The present invention relates in general to control of video head tracking by detecting auto tracking find (ATF) error in a video cassette tape recorder (VCR), and more particularly to a method and a circuit for detecting an auto tracking find error in a VCR and controlling the capstan phase for correct video head tracking, wherein a phase control range for a capstan is widened so that, when a phase of the capstan is widely deviated, the convergence speed for stabilization of the phase of the capstan can be made fast.

2. Description of the Prior Art

Referring to FIG. 1, there is shown a block diagram of a conventional apparatus for controlling the rotation of a capstan motor in an 8 mm VCR. As shown in this figure, a speed error signal SE is generated based on a difference between a detected rotation speed of the capstan motor 8 and a target rotation speed. An auto tracking find (ATF) signal is detected from a radio frequency (RF) signal of a video signal reproduced from a tape. An auto tracking find (ATF) error is detected based on the ATF signal and a phase error signal PE is generated based on the detected ATF error. The operation of the capstan motor 8 is controlled according to the phase error signal PE and the speed error signal SE. As a result, the auto tracking find operation can be performed.

To put it concretely, the conventional apparatus for controlling the rotation of the capstan motor 8 comprises a rotation speed detector 9 for detecting a rotation speed signal FG corresponding to the rotation speed of the capstan motor 8. The detected rotation speed signal FG from the rotation speed detector 9 is applied to a speed error detecting circuit 1 via a wave shaping circuit 11. In the speed error detecting circuit 1, an interval between adjacent rising edges or between the rising edge and the following falling edge of the rotation speed signal FG is detected and a difference between the detected interval and a target interval of the target rotation speed is also detected. The speed error signal SE is generated in the speed error detecting circuit 1 based on the detected difference.

Upon receiving the video RF signal from the tape, an ATF signal detecting circuit 10 detects the ATF signal from the received video RF signal in response to ATF signal frequency select signals SEL1 and SEL2 and applies the detected ATF signal to an ATF error detecting circuit 3 which generates the ATF signal frequency select signals SEL1 and SEL2 in response to a head switching signal HSW. Also, the ATF error detecting circuit 3 detects the ATF error based on the ATF signal from the ATF signal detecting circuit 10 and generates the phase error signal PE based on the detected ATF error. The speed error signal SE and the phase error signal PE generated in this manner are applied via speed and phase filters 2 and 4 to an adder 5 which adds the applied signals SE and PE. An output signal from the adder 5 is converted into an analog signal in a digital/analog (D/A) converter 6 which applies the analog signal to a motor driving circuit 7 as a drive signal for controlling the rotation of the capstan motor 8. As a result, the rotation speed and phase of the capstan motor 8 can be controlled by the motor driving circuit 7.

On the other hand, as shown in FIG. 2 which is a view illustrating a general detection of the ATF signal in the VCR, recorded on a video tape 21 are pilot signal tracks of frequencies f1–f4 which are disposed inclinedly at a desired angle with respect to a travelling direction of the video tape 21 together with data recorded on the tracks on the video tape 21 in the order of their disposition. For reproduction of the recorded data, the recorded data are reproduced as a video head 22 scans along the tracks on the video tape 21. At this time, in the case where a center position of the video head 22 is scanning the track recorded with the pilot signal of frequency f2, the video head 22 scans also with portions of the adjacent tracks recorded with the pilot signals of the frequencies f1 and f3 respectively as well as the track recorded with the pilot signal of the frequency f2. For this reason, the reproduced RF signal contains the data signal recorded on the center track recorded with the pilot signal of the frequency f2 together with the data signal components recorded on the adjacent tracks having pilot signals of the frequencies f1 and f3 respectively.

Accordingly, assuming that the frequency f2 is selected as an ATF signal frequency based on the ATF signal frequency select signals SEL1 and SEL2 in the ATF signal detecting circuit 10, the ATF signal detecting circuit 10 detects a difference signal between a signal of $f1-f2=f_H$ (about 15.9 KHz) and a signal of $f3-f2=3f_H$ (about 47.1 KHz) among the reproduced pilot frequency signals of f1+f2, f1−f2, f2+f2, f3+f2, f3−f2. The detected difference signal is outputted as the ATF signal through an amplifier having a reference voltage Vcc/2.

Referring to FIG. 3, there is shown a block diagram of the ATF error detecting circuit 3 in the conventional apparatus for controlling the rotation of the capstan motor 8. As shown in this figure, the ATF error detecting circuit 3 comprises an edge detector 3-1 for detecting an edge of the head switching signal HSW, an up-counter 3-2 for inputting an output signal from the edge detector 3-1 as a reset signal and up-counting a clock signal CK in response to the reset signal, a frequency divider 3-4 for frequency-dividing the head switching signal HSW by 2, an ATF signal frequency select signal generator 3-3 for generating the ATF signal frequency select signals SEL1 and SEL2, respectively, at times that a count value from the up-counter 3-2 is in accord with predetermined values based on an output signal ½ HSW from the frequency divider 3-4 and the head switching signal HSW, a first ATF check comparator 3-5 for comparing the count value from the up-counter 3-2 with a first ATF check reference value and outputting a control signal E1 at a timing of the ATF signal frequency as a result of the comparison, a second ATF check comparator 3-6 for comparing the count value from the up-counter 3-2 with a second ATF check reference value and outputting a control signal E2 at a timing having a capstan phase difference of π from the tracks recorded with the ATF signal frequency as a result of the comparison, an OR gate 3-7 for ORing the control signals E1 and E2 from the first and second ATF check comparators 3-5 and 3-6, and an analog/digital (A/D) converter 3-8 for converting the analog ATF signal from the ATF signal detecting circuit 10 into digital data in response to an output signal from the OR gate 3-7 as an enable signal. The ATF error detecting circuit 3 also comprises a subtracter 3-9 for subtracting a reference value Dref from the output data from the A/D converter 3-8, a first delay 3-10 for delaying the control signal E1 from the first ATF check comparator 3-5 by the A/D conversion time of the A/D converter 3-8, a second delay 3-11 for delaying the control signal E2 from the second ATF check comparator 3-6 by the A/D conversion time of the A/D converter 3-8, a first latch 3-12 for latching the output data from the subtracter 3-9 in response to an output signal from the first delay 3-10, a second latch 3-13 for latching the output data from the subtracter 3-9 in response to an output signal from the second delay 3-11, a first comparator 3-14 for inputting latch data D.ATF1 from the first latch 3-12 at its non-inverting input terminal and comparing the inputted latch data D.ATF1 with a reference value (ground voltage) input at its inverting input terminal, a second comparator 3-15 for inputting latch data D.ATF2 from the second latch 3-13 at its inverting input terminal and comparing the inputted latch data D.ATF2 with a reference value (ground voltage) input at its non-inverting input terminal, a first switch 3-16 for selecting an upper limit value $U_H$ from an upper limit circuit 3-18 or a lower limit value $U_L$ from a lower limit circuit 3-19 in response to an output signal $C_2$ from the first comparator 3-14, and a second switch 3-17 for selecting the latch data D.ATF1 from the first latch 3-12 or an output signal from the first switch 3-16 in response to an output signal $C_1$ from the second comparator 3-15 and outputting the selected signal as the phase error signal PE.

The operation of the ATF error detecting circuit 3 with the above-mentioned construction will hereinafter be described.

Referring to FIGS. 4A to 4G, there are shown timing diagrams of the signals from the respective components in the ATF error detecting circuit 3. First as shown in FIG. 4A, upon input of the head switching signal HSW, the edge of the head switching signal HSW is detected as shown in FIG. 4C in the edge detector 3-1 which applies the detected edge signal as the reset signal to the up-counter 3-2. As shown in FIG. 4D, the up-counter 3-2 up-counts the number of the clocks CK between the edges of the head switching signal HSW in response to the reset signal from the edge detector 3-1. On the other hand, the head switching signal HSW is frequency-divided by 2 as shown in FIG. 4B in the frequency divider 3-4 which applies the ½-frequency-divided head switching signal ½ HSW to the ATF signal frequency select signal generator 3-3, which outputs the ATF signal frequency select signals SEL1 and SEL2, respectively, at the time that the count value from the up-counter 3-2 is in accord with the predetermined values based on the output signal ½ HSW from the frequency divider 3-4 and the head switching signal HSW, as shown in FIG. 4E.

The ATF signal frequency select signals SEL1 and SEL2 cooperate with each other to select the present track's ATF signal frequency and the succeeding track's ATF signal frequency being the ATF signal frequency of that track shifted in head-scanning relation along the tape by π in terms of the phase of the capstan rotation from the present track as the successive ATF signal frequencies, every one-half period of the head switching signal HSW.

The first and second ATF check comparators 3-5 and 3-6 act to compare the count value from the up-counter 3-2 with the respective ATF check reference values and generate the control signals E1 and E2 as shown in FIG. 4F as a result of the comparison, respectively.

In other words, when a certain track is scanned by the video head, the A/D conversion for the ATF signal is performed two times during each interval between adjacent edges of the head switching signal HSW, i.e., a high level interval or a low level interval of the head switching signal HSW. Points of A/D conversion time are times T1 and T2 lapsed by predetermined time periods from the edge of the head switching signal HSW. For this reason, the first ATF check comparator 3-5 determines the count value from the up-counter 3-2 at the time T1 as the first reference value, compares the output data from the up-counter 3-2 with the first reference value and generates the control signal E1 as a trigger pulse signal if they are the same. Also, the second ATF check comparator 3-6 determines the count value from the up-counter 3-2 at the time T2 as the second reference value, compares the output data from the up-counter 3-2 with the second reference value and generates the control signal E2 as a trigger pulse signal if they are the same.

The control signals E1 and E2 generated in this manner are ORed by the OR gate 3-7 which applies the ORed signal as an enable signal to the A/D converter 3-8. In response to the enable signal, the A/D converter 3-8 converts the analog ATF signal into a digital ATF signal. The subtracter 3-9 subtracts the reference data Dref from the digital ATF signal from the A/D converter 3-8 and loads the difference data into the first and second latches 3-12 and 3-13.

It is herein noted that an ATF error value can be obtained by subtracting Vcc/2 from the ATF signal since the ATF signal is outputted through the amplifier having the reference value of Vcc/2 in the ATF signal detecting circuit 10. As a result, in the subtracter 3-9, the ATF error value is obtained by subtracting the reference data Dref of Vcc/2 from the digital ATF data D.ATF from the A/D converter 3-8.

On the other hand, the control signals E1 and E2 from the first and second ATF check comparators 3-5 and 3-6 are delayed respectively in the first and second delays 3-10 and 3-11 which apply the delayed signals, respectively, as enable signals to the first and second latches 3-12 and 3-13 for latching the output data from the subtracter 3-9. In result, the latches 3-12 and 3-13 latch, respectively, the digital data into which the ATF signals of the present track's ATF signal frequency and the succeeding track's ATF signal frequency (where the ATF signal frequency of the succceeding track is shifted in head-scanning relation along the tape by π in terms of the phase of the capstan rotation from the present track) are converted every one-half period of the head switching signal HSW.

The ATF data A/D-converted at the time of the control signal E1 is the ATF signal of the present track's ATF signal frequency which indicates whether the video head centered on the track having a pilot signal of the frequency f2 leans toward either of the adjacent tracks having respective pilot signals of the frequencies f1 or f3. Also, the ATF data A/D-converted at the time of the control signal E2 is the ATF signal of the succeeding track shifted in head-scanning relation along the tape by π from the present track which indicates whether the video head is centered on the track having a pilot signal of the frequency 12 or f4 among the tracks having respective pilot signals of the frequencies f1–f4. Namely, the data D.ATF1 latched in the first latch 3-12 is normal phase error data and the data D.ATF2 latched in the second latch 3-13 is data for determining the position of the video head.

FIG. 4G shows a voltage waveform of the ATF signal and the points of A/D conversion time for the ATF signal in the case of checking the frequency f2 as the ATF signal frequency. For example, if the video head is centered on the center of the track recorded with the pilot signal of frequency f2, the ATF voltage of the frequency f2 is normally Vcc/2 and the ATF voltage of the frequency f3 is normally higher than Vcc/2. As a result, the ATF error is generated corresponding to a difference when the ATF voltage of the frequency f2 is higher or lower than Vcc/2. If the ATF signal (A/D-converted at the time of the control signal E2) is higher than Vcc/2, the video head is scanning in the middle of the tracks of the frequencies f1, f2 and f3. If the ATF signal (A/D-converted at the time of the control signal E2) is lower than Vcc/2, the video head is scanning in the middle of the tracks of the frequencies f3, f4 and f1.

Accordingly, the ATF voltages of the present track's pilot signal frequency f2 and the succeeding track's pilot signal frequency f3 (where the pilot signal of the succeeding track is shifted in head-scanning relation along the tape by $\pi$ from the present track and recorded with the pilot signal of frequency f2) are checked to determine whether the track being scanned by the video head is in a normal position and is any one of the tracks respectively recorded with pilot signals of the frequencies f1–f4. The control signals E1 and E2 are generated respectively at times T1 and T2 lapsed by the predetermined time periods from the edges of the head switching signal HSW. The ATF signal of the frequency f2 and the ATF signal of the frequency f3 are A/D-converted respectively based on the generated control signals E1 and E2. In result, the digitized data of the ATF signals after having subtracted therefrom the reference data of Vcc/2 are latched in the first and second latches 3-12 and 3-13, respectively.

The data D.ATF1 latched in the first latch 3-12 is applied to the non-inverting input terminal of the first comparator 3-14 for comparison with the reference value (ground voltage) and the data D.ATF2 latched in the second latch 3-13 is applied to the inverting input terminal of the second comparator 3-15 for comparison with the reference value (ground voltage).

The output signal $C_1$ from the first comparator 3-14 is applied as a control signal to the first switch 3-16 such that the first switch 3-16 selects the upper limit value $U_H$ from the upper limit circuit 3-18 or the lower limit value $U_L$ from the lower limit circuit 3-19. Also, the output signal $C_2$ from the second comparator 3-15 is applied as a control signal to the second switch 3-17 such that the second switch 3-17 selects the latch data D.ATF1 from the first latch 3-12 or the output signal from the first switch 3-16 and outputs the selected signal as the phase error signal PE.

If the latch data D.ATF2 from the second latch 3-13 is higher than the reference value (ground voltage), the second switch 3-17 selects the latch data D.ATF1 from the first latch 3-12 and outputs it as the phase error signal PE. On the other hand, if the latch data D.ATF2 from the second latch 3-13 is lower than the reference value (ground potential), the second switch 3-17 selects the output signal from the first switch 3-16. In this case, if the latch data D.ATF1 from the first latch 3-12 is higher than the reference value (ground voltage), the first switch 3-16 selects the upper limit value $U_H$ from the upper limit circuit 3-18. As a result, the second switch 3-16 outputs the upper limit value $U_H$ from the upper limit circuit 3-18 as the phase error signal PE. On the contrary, if the latch data D.ATF1 from the first latch 3-12 is lower than the reference value (ground voltage), the first switch 3-16 selects the lower limit value $U_L$ from the lower limit circuit 3-19. As a result, the second switch 3-16 outputs the lower limit value $U_L$ from the lower limit circuit 3-19 as the phase error signal PE.

Referring to FIGS. 5A to 5C, there are shown timing diagrams for generation of the phase error signal PE in the ATF error detecting circuit 3. The first and second comparators 3-14 and 3-15 control the first and second switches 3-16 and 3-17 at the timing of FIGS. 5A and 5B such that the upper limit value $U_H$ is selected as the phase error signal PE in the interval of $-2\pi$ to $-\pi$ of the phase of the capstan as shown in FIG. 5C and the lower limit value $U_L$ is selected as the phase error signal PE in the interval $\pi$ to $2\pi$ of the phase of the capstan as shown in FIG. 5C.

However, the conventional ATF error detecting circuit 3 has a disadvantage, in that a phase control range for the capstan is limited to the interval of $-\pi$ to $\pi$ since the upper limit value $U_H$ is outputted as the phase error signal PE regardless of a phase variation in the interval of $-2\pi$ to $-\pi$ of the phase of the capstan and the lower limit value $U_L$ is outputted as the phase error signal PE regardless of a phase variation in the interval of $\pi$ to $2\pi$ of the phase of the capstan. Generally, in the control of the rotation of the capstan, it is preferred to control the phase variation over the whole of the intervals of $-2\pi$ to $-\pi$ and $\pi$ to $2\pi$, of the phase of the capstan. For this reason, in the conventional ATF error detecting circuit 3, since the phase control range for the capstan is limited to the interval of $-\pi$ to $\pi$, although the video head tracking of the tape in terms of the phase of the capstan may be deviated by $-2\pi$ or $2\pi$, the convergence speed for stabilization of the phase of the capstan motor is very slow in a range below $-\pi$ or above $\pi$. This results in inappropriateness of the circuit to a high speed system.

SUMMARY OF THE INVENTION

Therefore, the present invention has been made in view of the above problem, and it is an object of the present invention to provide a method and a circuit for detecting an auto tracking find error in a VCR and accordingly controlling the phase of the capstan for correcting video head tracking deviation on the tape, wherein a phase control range for a capstan is widened as compared with the prior art so that, when a video head tracking position on the tape in terms of the phase of the capstan is widely deviated, the convergence speed for stabilization of correct video head tracking of the tape by controlling the phase of the capstan can be made fast.

In accordance with one aspect of the present invention, there is provided a method of detecting an ATF error in a VCR and accordingly controlling a phase of a capstan for correcting video head tracking deviation on a tape, comprising: the steps of selecting an ATF error signal at the present track's ATF pilot signal frequency as a phase control signal PE in an interval of $-\pi$ to $\pi$ of a phase of a capstan, for control of the phase of the capstan; and selecting data meeting the following equation as the phase error signal PE in intervals of $-2\pi$ to $-\pi$ and $\pi$ to $2\pi$ of the phase of the capstan, for control of the phase of the capstan:

$$PE = D.ATF1 + (|D.ATF2 \times 2|) \ldots D.ATF1 \geq 0$$

$$PE = D.ATF1 - (|D.ATF2 \times 2|) \ldots D.ATF1 < 0$$

where, D.ATF1 is the ATF error signal at the present track's ATF pilot signal frequency and D.ATF2 is the ATF error signal
at the succeeding track's ATF pilot signal frequency being the pilot signal frequency recorded on the track shifted in head-tracking position along the tape in terms of the capstan phase by $\pi$ from the present track,
a portion of the data meeting the above equation exceeding two times the upper limit value being cut in the interval of $-2\pi$ to $-\pi$ and a portion of the data meeting the above equation falling below two times the lower limit value being cut in the interval of $\pi$ to $2\pi$.

In accordance with another aspect of the present invention, there is provided a circuit for detecting an ATF error in a VCR and accordingly controlling a phase of a capstan for correcting video head tracking deviation on a tape, comprising: an ATF signal frequency selecting circuit for generating ATF signal frequency select signals based on a head switching signal and a ½ head switching signal; a latching circuit having first and second latches for latching, respectively, ATF error values at the present track's ATF signal frequency and at the following track's ATF signal frequency being the ATF signal frequency of the track shifted in head-tracking relation along the tape in terms of capstan phase by $\pi$ from the present track based on the head switching signal; a multiplying circuit for multiplying latch data from the second latch by two, the multiplied latch data being of the same polarity as that of latch data in the first latch; an upper limit/lower limit control circuit for adding the latch data from the first latch to output data from the multiplying circuit and comparing the added value with a doubled upper limit value and a doubled lower limit value to selectively output one of the added value, the doubled upper limit value and the doubled lower limit value; and a phase control signal outputting circuit for selecting one of the latch data in the first latch and the output data from the upper limit/lower limit control circuit in accordance with the latch data in the second latch and outputting the selected data as a phase control signal.

BRIEF DESCRIPTION OF THE DRAWINGS

The above and other objects, features and advantages of the present invention will be more clearly understood from the following detailed description taken in conjunction with the accompanying drawings, in which:

FIGS. 7A to 7E are timing diagrams for generation of a phase error signal in the circuit of FIG. 6.

DETAILED DESCRIPTION OF THE PREFERRED EMBODIMENTS

Figure 1:
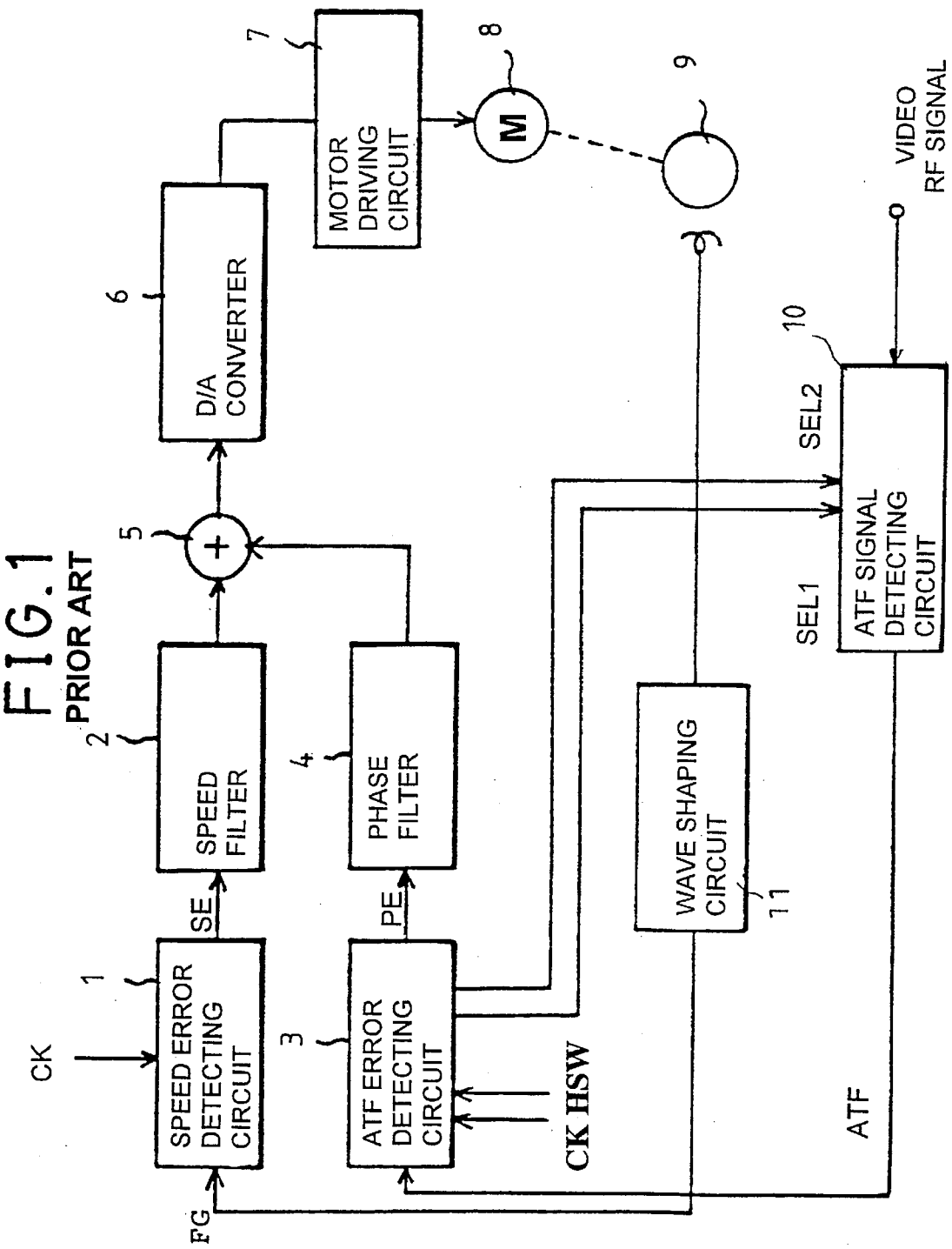
FIG. 1 is a block diagram of a conventional apparatus for controlling a rotation of a capstan motor in a VCR.
Figure 2:
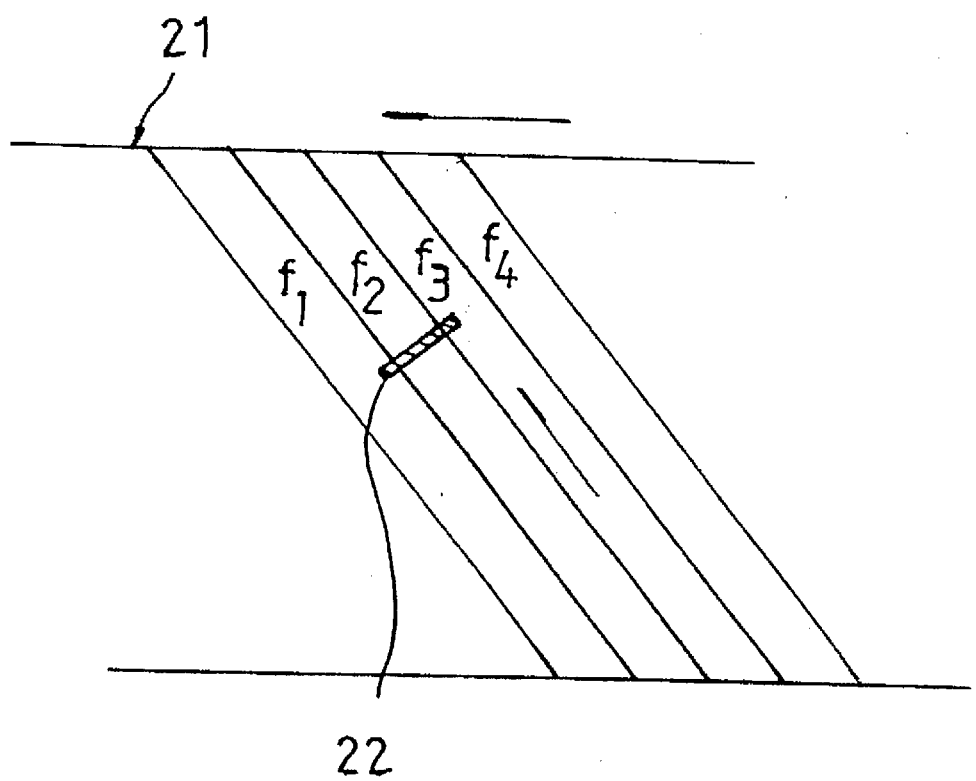
FIG. 2 is a view illustrating a general detection of an ATF signal in the VCR.
Figure 3:
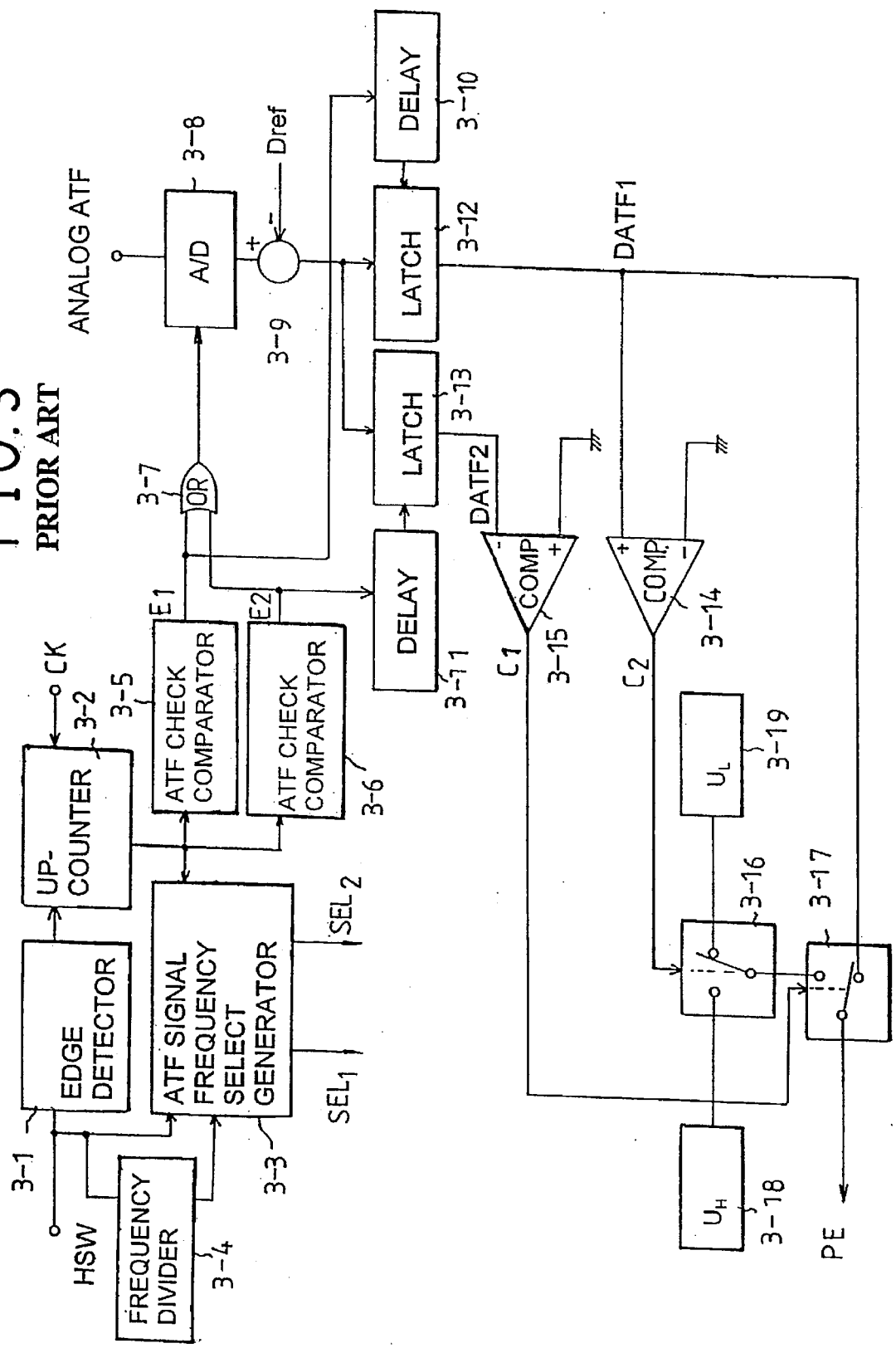
FIG. 3 is a block diagram of an ATF error detecting circuit in the conventional apparatus of FIG. 1.

In the method of detecting an ATF error in a VCR and accordingly controlling a phase of a capstan for correcting video head tracking deviation on a tape in accordance with the present invention, ATF signal frequency select signals SEL1 and SEL2 are generated such that the present track's ATF signal frequency and the succeeding track's ATF signal frequency (where the ATF signal frequency of the succeeding track is shifted in headtracking relation along the tape in terms of capstan phase by $\pi$ from the present track) are selected as successive ATF signal frequencies, every one-half period of a head switching signal HSW. ATF error signals detected at the present track's ATF signal frequency and the succeeding track's ATF signal frequency are latched as first and second latch data D.ATF1 and D.ATF2, respectively.

In an interval of $-\pi$ to $\pi$ of the phase of the capstan, the first latch data D.ATF1 is selected as a phase error signal PE for control of the phase of the capstan. In intervals of $-2\pi$ to $-\pi$ and $\pi$ to $2\pi$ of the phase of the capstan, data meeting the following equation is selected as the phase error signal PE for control of the phase of the capstan:

$$PE=D.ATF1+(|D.ATF2\times 2|)\ldots D.ATF1\geq 0$$

$$PE=D.ATF1-(|D.ATF2\times 2|)\ldots D.ATF1<0$$

where, D.ATF1 is the ATF error signal detected at the present track's ATF signal frequency and D.ATF2 is the ATF error signal detected at the succeeding track's ATF signal frequency, a portion of the data meeting the above equation exceeding two times the upper limit value $2U_H$ being cut in the interval of $-2\pi$ to $-\pi$ and a portion of the data meeting the above equation falling below two times the lower limit value $2U_L$ being cut in the interval of $\pi$ to $2\pi$.

Namely, in the intervals of $-2\pi$ to $-\pi$ and $\pi$ to $2\pi$, the second latch data D.ATF2 is multiplied by two and is then made the same polarity as that of the first latch data D.ATF1. The second latch data D.ATF2 multiplied by two is added to the first latch data D.ATF1. In result, the added value is selected as the phase error signal PE.

Also as shown in FIG. 7E, when the phase error signal PE is outputted, components at portions m and n thereof are reduced or increased. In order to avoid such component reduction and increase, the phase error signal PE portion above the doubled upper limit value $2U_H$ is cut in the interval of $-2\pi$ to $-\pi$ and the phase error signal PE portion below the doubled lower value $2U_L$ is cut in the interval of $\pi$ to $2\pi$. As a result, the phase control range can be between L1–L2 including the interval between $-\pi$ and $\pi$. Assuming that the capstan phase curve is an ideal sine wave, $L1=-5/4\pi$ and $L2=5/4\pi$. In accordance with the present invention, the phase control data is between $2U_H-2U_L$ ($U_H-U_L$ in the prior art). Therefore, when the deviation in video head tracking position along the tape in terms of the phase of the capstan is within the intervals $-2\pi$ to $-\pi$ and $\pi$ to $2\pi$, the convergence speed on correcting the phase of the capstan can be made fast as compared with the prior art.

Figure 6:
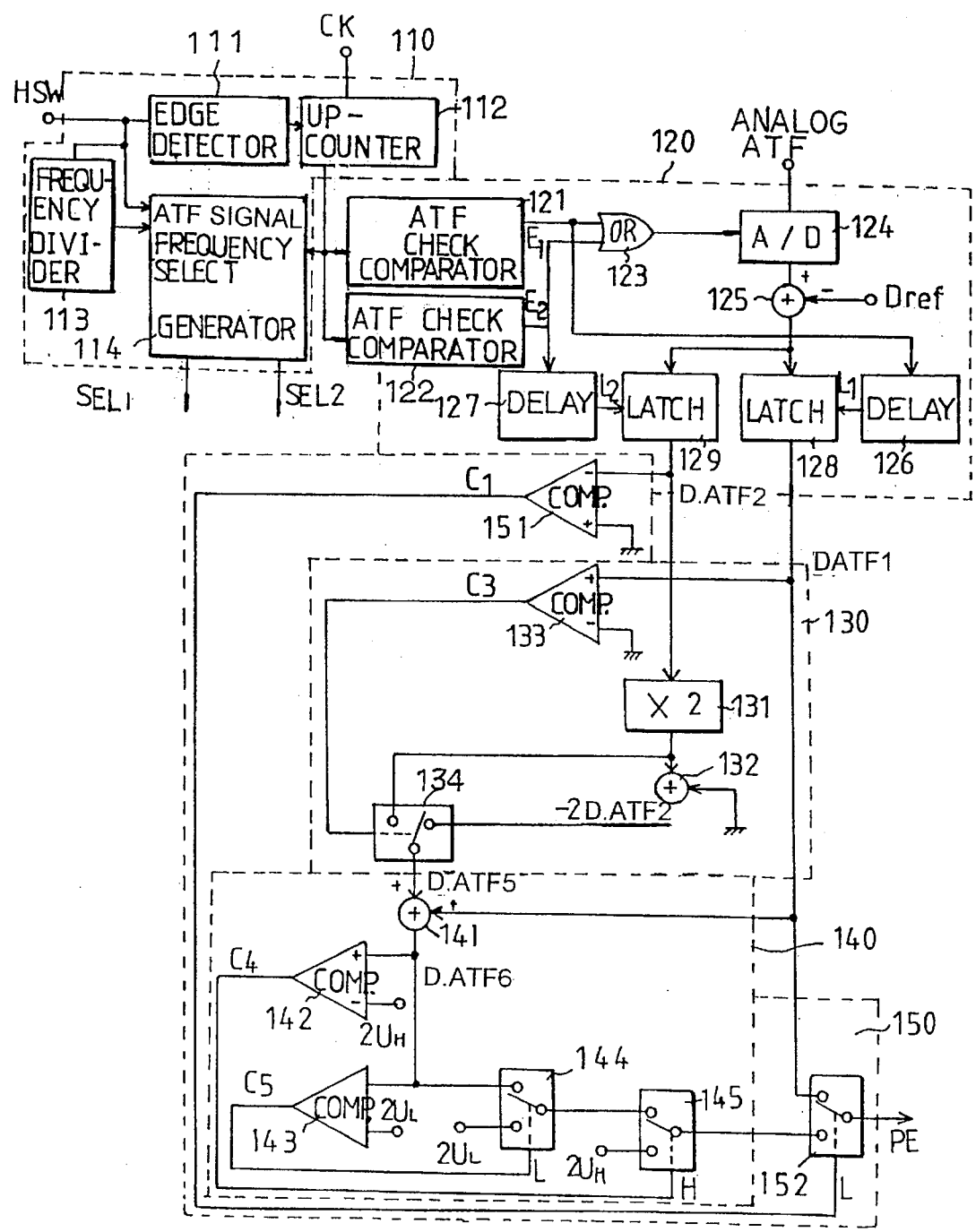
FIG. 6 is a block diagram of a circuit for detecting an ATF error in a VCR and accordingly controlling a phase of a capstan for correcting video head tracking deviation on a tape in accordance with the present invention.

Referring to FIG. 6, there is shown a block diagram of a circuit for detecting an ATF error in a VCR and accordingly controlling a phase of a capstan for correcting video head tracking deviation on a tape in accordance with the present invention. As shown in this figure, the ATF error detecting circuit of the present invention comprises an ATF signal frequency selecting circuit 110 for generating AFT signal frequency select signals SEL1 and SEL2 to select the present track's ATF signal frequency and the succeeding track's ATF signal frequency as successive ATF signal frequencies every one-half period of a head switching signal HSW and outputting the generated ATF signal frequency select signals SEL1 and SEL2 to an ATF signal detecting circuit such as to the ATF signal detecting circuit 10 shown in FIG. 1, a latching circuit 120 for latching in its first and second latches 128 and 129, respectively, error values of ATF signals outputted from the ATF signal detecting circuit at timings of the present track's ATF signal frequency and the succeeding track's ATF signal frequency based on the head switching signal HSW, a multiplying circuit 130 for multiplying latch data D.ATF2 latched out of the second latch 129 by two, the latch data D.ATF2 being of the same polarity as that of latch data D.ATF1 latched out of the first latch 128, an upper limit/lower limit control circuit 140 for adding the latch data D.ATF1 latched out of the first latch 128 to output data from the multiplying circuit 130 and comparing the added value with the doubled upper limit value $2U_H$ and the doubled lower limit value $2U_L$, respectively, selectively output one of the added value, the doubled upper limit value $2U_H$ and the doubled lower limit value $2U_L$, and a phase control signal outputting circuit 150 for selecting one of the latch data D.ATF1 latched out of the first latch 128 and output data from the upper limit/lower limit control circuit 140 in accordance with the latch data D.ATF2 latched out of the second latch 129 and outputting the selected data as a phase control signal; phase error signal—PE.

The center frequency selecting circuit 110 includes an edge detector 111 for detecting the edges of the head switching signal HSW, an up-counter 112 for inputting an output signal from the edge detector 111 as a reset signal and up-counting a clock signal CK in response to the reset signal, a frequency divider 113 for frequency-dividing the head switching signal HSW by 2, and an ATF signal frequency select signal generator 114 for generating the ATF signal frequency select signals SEL1 and SEL2, respectively, at times that a count value from the up-counter 112 is in accord with predetermined values based on an output signal ½ HSW from the frequency divider 113 and the head switching signal HSW.

The latching circuit 120 includes a first ATF check comparator 121 for comparing the count value from the up-counter 112 with an ATF check reference value and outputting a control signal E1 at the timing of the selection of the ATF signal frequency of the track presently being scanned as a result of the comparison, a second ATF check comparator 122 for comparing the count value from the up-counter 112 with an ATF check reference value and outputting a control signal E2 at the timing of the selection of the ATF signal frequency corresponding to a succeeding track at a head-scanning position of the tape having a phase difference in terms of the rotation of the capstan of $\pi$ from the track presently being scanned as a result of the comparison, an OR gate 123 for ORing the control signals E1 and E2 from the first and second ATF check comparators 121 and 122, and an analog/digital (A/D) converter 124 for converting the analog ATF signals from the ATF signal detecting circuit 10 into digital data in response to an output signal from the OR gate 123 as an enable signal, a subtracter 125 for subtracting a reference value Dref from output data from the A/D converter 124, a first delay 126 for delaying the control signal E1 from the first ATF check comparator 121 by the A/D conversion time of the A/D converter 124, and a second delay 127 for delaying the control signal E2 from the second ATF check comparator 122 by the A/D conversion time of the A/D converter 124. The first latch 128 latches the output data from the subtracter 125 in response to an output signal from the first delay 126 and the second latch 129 latches the output data from the subtracter 125 in response to an output signal from the second delay 127.

The multiplying circuit 130 includes a multiplier 131 for multiplying the latch data D.ATF2 from the second latch 129 in the latching circuit 120 by two, an inverter 132 for inverting the output data 2D.ATF2 from the multiplier 131 into data −2D.ATF2, a first comparator 133 for inputting the latch data D.ATF1 from the first latch 128 in the latching circuit 120 at its non-inverting input terminal and comparing the inputted latch data D.ATF1 with a reference value (ground voltage) at its inverting input terminal, and a switch 134 for selecting one of output data −2D.ATF2 from the inverter 132 and the output data D.ATF2 from the multiplier 131 in response to an output signal $C_3$ from the comparator 133.

The upper limit/lower limit control circuit 140 includes an adder 141 for adding the output data D.ATF1 from the first latch 128 to output data D.ATF5 from the switch 134 in the multiplying circuit 130, a comparator 142 for comparing output data D.ATF6 from the adder 141 inputted at its non-inverting input terminal with the doubled upper limit value $2U_H$ inputted at its inverting input terminal, a comparator 143 for comparing the output data D.ATF6 from the adder 141 inputted at its inverting input terminal with the doubled lower limit value $2U_L$ inputted at its non-inverting input terminal, a switch 144 for selecting one of the output data D.ATF6 from the adder 141 and the doubled lower limit value $2U_L$ in response to the output signal from the comparator 143, and a switch 145 for selecting one of the output data from the switch 144 and the doubled upper limit value $2U_H$ in response to an output signal from the comparator 142.

The phase control signal outputting circuit 150 includes a comparator 151 for inputting the latch data D.ATF2 from the second latch 129 at its inverting input terminal and comparing the inputted latch data D.ATF2 with a ground voltage at its non-inverting input terminal, and a switch 152 for selecting one of the output data from the switch 145 in the upper limit/lower limit control circuit 140 and the latch data D.ATF1 from the first latch 128 in the latching circuit 120 in response to an output signal from the comparator 151 and outputting the selected data as the phase error signal PE.

The operation of the ATF error detecting and video head tracking correction circuit with the above-mentioned construction in accordance with the present invention will hereinafter be described in detail.

Figure 4:
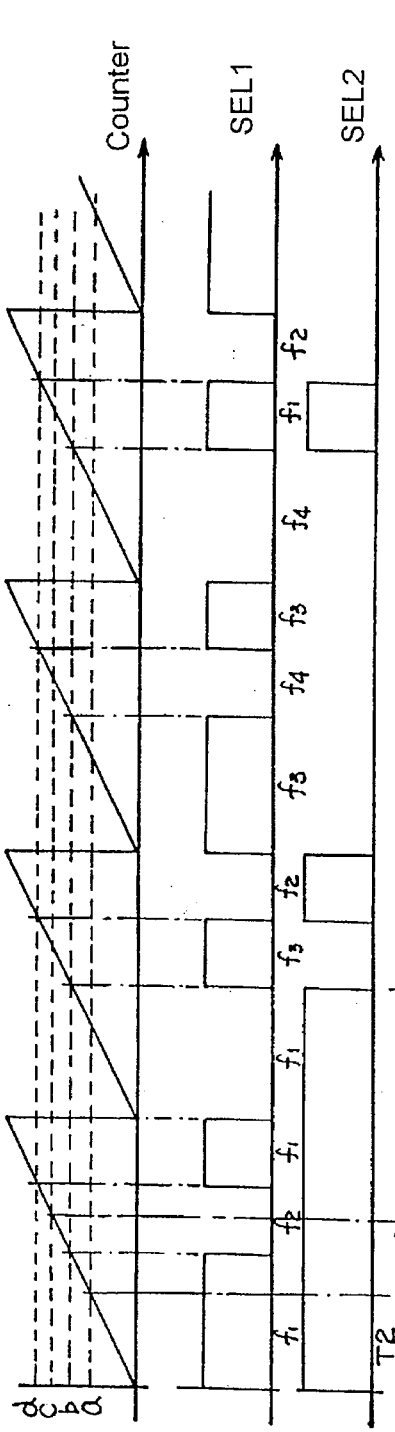
FIGS. 4A to 4G are timing diagrams of signals from respective components in the circuit of FIG. 3.
Figure 5:
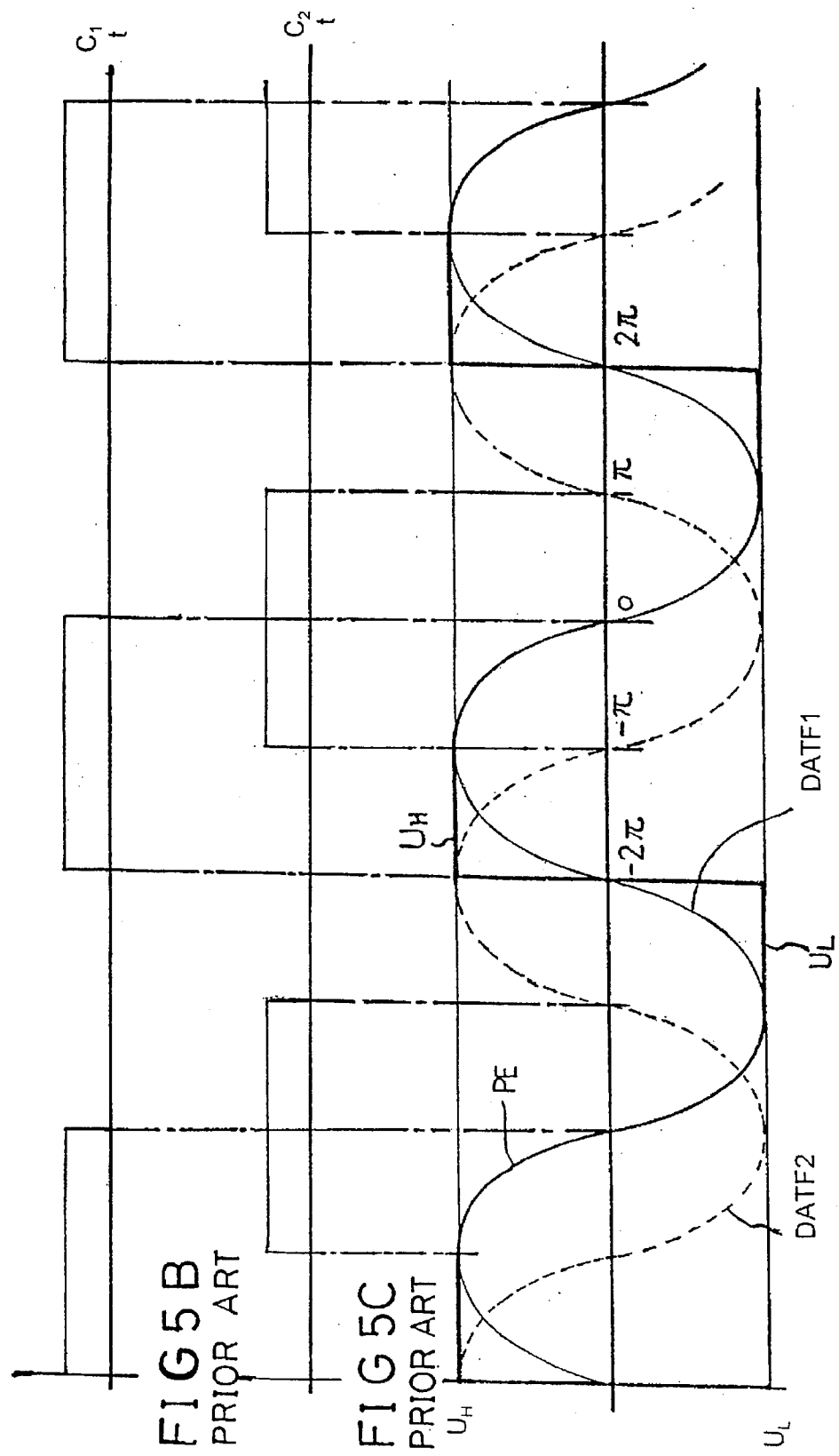
FIGS. 5A to 5C are timing diagrams for generation of a phase error signal in the circuit of FIG. 3.

As mentioned previously, upon input of the head switching signal HSW as shown in FIG. 4A, the edges of the head switching signal HSW are detected as shown in FIG. 4C in the edge detector 111 which applies the detected edge signal as the reset signal to the up-counter 112. As shown in FIG. 4D, the up-counter 112 up-counts the number of the clocks CK between the edges of the head switching signal HSW in response to the reset signal from the edge detector 111. On the other hand, the head switching signal HSW is frequency-divided by 2 as shown in FIG. 4B in the frequency divider 113 which applies the ½-frequency-divided head switching signal ½HSW to the ATF signal frequency select signal generator 114, which outputs the ATF signal frequency select signals SEL1 and SEL2, respectively, at the times that the count value from the up-counter 112 is in accord with the predetermined values based on the output signal ½HSW from the frequency divider 113 and the head switching signal HSW, as shown in FIG. 4E.

The ATF signal frequency select signals SEL1 and SEL2 cooperate with each other to select the present track's ATF signal frequency and the succeeding track's ATF signal frequency which succeeding track is shifted in head scanning position along the tape in terms of the phase of the capstan rotation by $\pi$ from the present track as the successive ATF signal frequencies, every one-half period of the head switching signal HSW.

The first and second ATF check comparators 121 and 122 act to compare the count value from the up-counter 112 with the respective ATF check reference values and generate the control signals E1 and E2 as shown in FIG. 4F as a result of the comparison, respectively.

In other words, when a certain track is scanned by the video head, the A/D conversion for the ATF signal is performed two times in each interval between adjacent edges of the head switching signal HSW, i.e., a high level interval or a low level interval of the head switching signal HSW. Points of A/D conversion time are times T1 and T2 lapsed by predetermined time periods from the edge of the head switching signal HSW. For this reason, the first ATF check comparator 121 determines the count value from the up-counter 112 at time T1 as the reference value, compares the output data from the up-counter 112 with the reference value and generates the control signal E1 as a trigger pulse signal if they are the same. Also, the second ATF check comparator 122 determines the count value from the up-counter 112 at time T2 as the reference value, compares the output data from the up-counter 112 with the reference value and generates the control signal E2 as a trigger pulse signal if they are the same.

The control signals E1 and E2 generated in this manner are ORed by the OR gate 123 which applies the ORed signal as an enable signal to the A/D converter 124. In response to the enable signal, the A/D converter 124 converts the analog ATF signal into a digital ATF signal. The subtracter 125 subtracts the reference data Dref from the digital ATF signal from the A/D converter 124 and loads the difference data into the first and second latches 128 and 129.

On the other hand, the control signals E1 and E2 from the first and second ATF check comparators 121 and 122 are delayed respectively in the first and second delays 126 and 127 which apply the delayed signals, respectively, as enable signals to the first and second latches 128 and 129 for latching the output data from the subtracter 125. In result, the latches 128 and 129 latch, respectively, the digital data into which the ATF signals of the present track and the succeeding track shifted in terms of the phase of the capstan rotation by $\pi$ from the present track are converted every one-half period of the head switching signal HSW.

The latch data D.ATF1 and D.ATF2 from the first and second latches 128 and 129 are applied, respectively, to the non-inverting input terminal of the comparator 133 and the inverting input terminal of the comparator 151 for comparison with the reference voltage (ground voltage). The output signals $C_3$ and $C_1$ from the comparators 133 and 151 are applied as control signals to the switches 134 and 152, respectively, as shown in FIGS. 7A and 7B.

The latch data D.ATF2 from the second latch 129 is also applied to the multiplier 131, which multiplies the applied latch data D.ATF2 by two and applies the multiplied data (2D.ATF2) to one input terminal of the switch 134 and to the other input terminal thereof through the inverter 132. In response to the output signal $C_3$ from the comparator 133, the switch 134 selects one of the two inputs. Namely, if the latch data D.ATF1 from the first latch 128 is higher than the ground voltage, the comparator 133 outputs a high signal enabling the switch 134 to select the output data 2D.ATF2 from the multiplier 131. On the contrary, if the latch data D.ATF1 from the first latch 128 is lower than the ground voltage, the comparator 133 outputs a low signal enabling the switch 134 to select the output data –2D.ATF2 from the inverter 132.

The output data D.ATF5 from the switch 134 is added to the latch data D.ATF1 from the first latch 128 in the adder 141, the output data D.ATF6 from which is compared with the doubled upper limit value $2U_H$ in the comparator 142 and with the doubled lower limit value $2U_L$ in the comparator 143, respectively. The output signals $c_4$, $c_5$ from the comparators 142 and 143 are applied as control signals to the switches 145 and 144, respectively, as shown in FIGS. 7C and 7D.

In other words, if the output data from the adder 141 is above the doubled lower limit value $2U_L$, the comparator 143 outputs a low signal enabling the switch 144 to select the output data D.ATF6 from the adder 141. On the contrary, if the output data D.ATF6 from the adder 141 is below the doubled lower limit value $2U_L$, the comparator 143 outputs a high signal enabling the switch 144 to select the doubled lower limit value $2U_L$.

On the other hand, if the output data D.ATF6 from the adder 141 is below the doubled upper limit value $2U_H$, the comparator 142 outputs a high signal enabling the switch 145 to select the output data from the switch 144. On the contrary, if the output data D.ATF6 from the adder 141 is above the doubled upper limit value $2U_H$, the comparator 142 outputs a low signal enabling the switch 145 to select the doubled upper limit value $2U_H$.

The switch 152 acts to select one of the output data from the switch 145 in the upper limit/lower limit control circuit 140 and the latch data D.ATF1 from the first latch 128 in the latching circuit 120 in response to the output signal $C_1$ from the comparator 151 and outputs the selected data as the phase error signal PE as shown in FIG. 7E. Namely, if the latch data D.ATF2 from the second latch 129 is higher than the ground voltage, the comparator 151 outputs a low signal enabling the switch 152 to select the latch data D.ATF1 from the first latch 128 and output the selected latch data D.ATF1 as the phase error signal PE. On the contrary, if the latch data D.ATF2 from the second latch 129 is lower than the ground voltage, the comparator 151 outputs a high signal enabling the switch 152 to select the output data from the switch 145 and output the selected data as the phase error signal PE.

As mentioned above with reference to FIG. 7E, in the interval of $-\pi$ to $\pi$ of the phase of the capstan, the first latch data D.ATF1 is selected as the phase error signal PE for control of the phase of the capstan. In the intervals of $-2\pi$ to $-\pi$ and $\pi$ to $2\pi$ of the phase of the capstan, the data meeting the following equation is selected as the phase error signal PE for control of the phase of the capstan:

$$PE = D.ATF1 + (|D.ATF2 \times 2|) \ldots D.ATF1 \geq 0$$

$$PE = D.ATF1 - (|D.ATF2 \times 2|) \ldots D.ATF1 < 0$$

Namely, in the intervals of $-2\pi$ to $-\pi$ and $\pi$ to $2\pi$, the second latch data D.ATF2 is multiplied by two. The second latch data D.ATF2 multiplied by two to become data 2D.ATF2 or inverted data –2D.ATF2 so as to rendered to be of the same polarity as the first latch data D.ATF1 and as consequent data D.ATF5 is added to the first latch data D.ATF1. In result, the added value D.ATF6 is selected as the phase error signal PE. Also, the data meeting the above equation but whose value exceeds the doubled upper limit value $2U_H$ is substituted by the doubled upper limit value $2U_R$ in the interval of $-2\pi$ and the data meeting the above equation but whose value falls below the doubled lower limit value $2U_L$ is substituted by the doubled lower limit value $2U_L$ in the interval of $\pi$ to $2\pi$.

As hereinbefore described, according to the present invention, the phase control range for the capstan can be widened from the interval of $-\pi$ to $\pi$ of the prior art to the interval of $-5/4\pi$ to $5/4\pi$. Therefore, the convergence speed for stabilization of the phase of the capstan and hence the correction of video head tracking deviation corresponding to a capstan phase error can be made fast as compared with the prior art. This has the effect of reducing the phase control time for the capstan.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. In a video recorder including a capstan driven by a motor wherein an auto tracking find ATF error of said video recorder corresponds to a phase error in the rotation of said capstan and including phase error generating means for generating a phase error signal as a function of a detected ATF error, a circuit for controlling the phase of the capstan over a range of $-2\pi$ to $2\pi$ of the rotational phase of the capstan in accordance with the detected ATF error, comprising:

means for driving the capstan motor with a drive signal;
means for generating the drive signal in response to a tracking error signal generated by tracking error signal generating means including;
ATF signal frequency selecting means for generating ATF signal frequency select signals based on a head switching signal and a ½ head switching signal;
latching means having first and second latches for latching, respectively, a first ATF error value detected at an ATF signal frequency of a present track and a second ATF error value detected at an ATF signal frequency of a succeeding track shifted in terms of the rotational phase of said capstan by $\pi$ from the present track, based on the head switching signal;
multiplying means for multiplying said second ATF error value by two;
limit control means for adding the first ATF error value to output data from said multiplying means to form an added value and comparing the added value with an upper limit value and a lower limit value to selectively output one of the added value, the upper limit value and the lower limit value; and
tracking error signal outputting means for selecting the first ATF error value in said first latch or the output data from said limit control means in accordance with second ATF error value in said second latch as the tracking error signal.

2. A circuit as set forth in claim 1, wherein said multiplying means includes:

a multiplier for multiplying the second ATF error value from said second latch in said latching means by two;
an inverter for inverting the output data from said multiplier;
a comparator for inputting the latch data from said first latch in said latching means at its non-inverting input terminal and comparing the inputted latch data with a reference value at its inverting input terminal; and
a switch for selecting one of output data from said inverter and the output data from said multiplier in response to an output signal from said comparator.

3. A circuit as set forth in claim 1, wherein said limit control means includes:

an adder for adding the first ATF error value from said first latch in said latching means to output data from said multiplying means;

a first comparator for comparing output data from said adder inputted with a non-inverting input with the upper limit value inputted with an inverting input;
a second comparator for comparing the output data from said adder inputted with an inverting input with the lower limit value inputted with a non-inverting input;
a first switch for selecting one of the output data from said adder and the lower limit value in response to an output signal from said second comparator; and
a second switch for selecting one of output data from said first switch and the upper limit value in response to an output signal from said first comparator.

4. A circuit as set forth in claim 2, wherein said tracking error signal outputting means includes:

a comparator for inputting the second ATF error value from said second latch in said latching means with an inverting input and comparing the inputted latch data with a ground voltage with a non-inverting input; and
a switch for selecting one of output data from said limit control means and the first ATF error value from said first latch in said latching means in response to an output signal from said comparator and outputting the selected data as the tracking error signal.

5. In a video recorder including a capstan driven by a motor wherein an auto tracking find ATF error of said video recorder corresponds to a phase error in the rotation of said capstan and including phase error generating means for generating a phase error signal as a function of a detected ATF error, a method of controlling the phase of the capstan over a range of $-2\pi$ to $2\pi$ of the rotational phase of the capstan in accordance with the detected ATF error, comprising the steps of:

driving the capstan motor with a drive signal;
generating the drive signal in response to a tracking error signal where the tracking error signal is generated by the steps of:
selecting with control circuit means said tracking error signal as the phase error signal in a range from $-\pi$ to $\pi$ of the rotational phase of the capstan;
generating a first value D.ATF1 in proportion to said phase error signal at a first ATF signal frequency of a present track;
generating a second value D.ATF2 in proportion to said phase error signal at a second ATF signal frequency of a succeeding track shifted in terms of the rotational phase of said capstan by $\pi$ from said present track;
selecting with said control circuit means said tracking error signal as equal to $$D.ATF1+|D.ATF2\times 2|$$

for D.ATF1 greater than or equal to 0;
selecting with said control circuit means said tracking error signal as equal to for D.ATF1 less than 0.

6. The method of claim 5 wherein said phase error ranges between $-2\pi$ and $-\pi$ and ranges between $\pi$ and $2\pi$.

7. In a video recorder including a capstan driven by a motor wherein an auto tracking find ATF error of said video recorder corresponds to a phase error in the rotation of said capstan and including phase error generating means for generating a phase error signal as a function of a detected ATF error, a method of controlling the phase of the capstan over a range of $-2\pi$ to $2\pi$ of the rotational phase of the capstan in accordance with a detected ATF error, comprising the steps of:

driving the capstan motor with a drive signal;

generating the drive signal in response to a tracking error signal where the tracking error signal is generated by the steps of:

selecting with control circuit means said tracking error signal as a phase error signal proportional to the capstan phase error in said range from $-\pi$ to $\pi$;

generating a first value D.ATF1 proportional to an ATF error detected at a first ATF signal frequency of a present track;

generating a second value D.ATF2 proportional to an ATF error detected at a second ATF signal frequency of a succeeding track shifted in terms of the phase of said capstan by $\pi$ from said present track;

selecting with said control circuit means said tracking error signal as equal to $$|D.ATF1+|D.ATF2\times 2||$$

for D.ATF1 greater than or equal to 0 in a range of said phase error from $-\pi$ to $\pi$;

selecting with said control circuit means said tracking error signal as equal to $$|D.ATF1-|D.ATF2\times 2||$$

for D.ATF1 less than 0 in a range of said phase error from $-\pi$ to $\pi$;

selecting with said control circuit means said tracking error signal as equal to a doubled upper limit amount in a range of said phase error from $-2\pi$ to $-5/4\pi$; and selecting with said control circuit means said tracking error signal as equal to a doubled lower limit amount in a range of said phase error from $5/4\pi$ to $2\pi$.

* * * * *